(12) United States Patent
Spatzierer

(10) Patent No.: US 10,871,593 B2
(45) Date of Patent: Dec. 22, 2020

(54) METHOD FOR INCREASING THE SPATIAL RESOLUTION OF A WEATHER FORECAST

(71) Applicant: UBIMET GmbH, Vienna (AT)

(72) Inventor: Manfred Spatzierer, Vienna (AT)

(73) Assignee: UBIMET GMBH, Vienna (AT)

( * ) Notice: Subject to any disclaimer, the term of this patent is extended or adjusted under 35 U.S.C. 154(b) by 433 days.

(21) Appl. No.: 15/860,189

(22) Filed: Jan. 2, 2018

(65) Prior Publication Data
US 2018/0188417 A1 Jul. 5, 2018

(30) Foreign Application Priority Data
Jan. 3, 2017 (EP) .................................... 17450001

(51) Int. Cl.
| G01W 1/10 | (2006.01) |
| G01W 1/00 | (2006.01) |
| G01W 1/02 | (2006.01) |
| G06F 30/20 | (2020.01) |

(52) U.S. Cl.
CPC ............... *G01W 1/10* (2013.01); *G01W 1/00* (2013.01); *G01W 1/02* (2013.01); *G06F 30/20* (2020.01)

(58) Field of Classification Search
USPC ............................................................ 702/3
See application file for complete search history.

(56) References Cited

U.S. PATENT DOCUMENTS

| 2004/0215394 A1* | 10/2004 | Carpenter, Jr. | ......... G01W 1/10 |
| | | | 702/3 |
| 2013/0085673 A1* | 4/2013 | Cavalcante | ............. G01W 1/10 |
| | | | 702/3 |
| 2013/0317749 A1* | 11/2013 | Borger | .................... G01W 1/10 |
| | | | 702/3 |
| 2014/0067270 A1* | 3/2014 | Gail | ........................ G01W 1/00 |
| | | | 702/3 |
| 2016/0061992 A1* | 3/2016 | Miller | .................... G06Q 10/10 |
| | | | 702/3 |
| 2017/0337663 A1* | 11/2017 | Bukchin | ................... H04N 1/46 |
| 2017/0371987 A1* | 12/2017 | Gibbas | .................... G06F 30/20 |

OTHER PUBLICATIONS

Harry R. Glahn et al., "The Use of Model Output Statistics (MOS) in Objective Weather Forecasting", J. Appl. Meteor., Dec. 11, 1972, pp. 1203-1211.

(Continued)

*Primary Examiner* — Paul D Lee
(74) *Attorney, Agent, or Firm* — Pillsbury Winthrop Shaw Pittman, LLP

(57) ABSTRACT

In a method for increasing the spatial resolution of a weather forecast, in which forecast predicted meteorological parameters are available for grid points of a first grid and the predicted meteorological parameters are interpolated to grid points of a second grid so as to obtain interpolated meteorological parameters, wherein the grid points of the second grid have a higher spatial resolution than the grid points of the first grid, a statistical postprocessing method is used to predict at least one output quantity of an analysis method by which forecast meteorological parameters can be interpolated to the grid points of the second grid.

15 Claims, 1 Drawing Sheet

(56) References Cited

OTHER PUBLICATIONS

Bob Glahn et al., "Gridded MOS—Techniques, Status, and Plans", 18th Conference on Probability and Statistics, Atlanta, GA, Amer. Meteor. Soc., 2006, 2.1, pp. 1-9.

Bob Glahn et al., "The Gridding of MOS", Weather and Forecasting, vol. 24, Apr. 2009, pp. 520-529.

D. Mayer, 2013: "VERA—Ein objektives Verfahren zur Analyse von meteorologischen Messwerten"("VERA—an objective method to analyse meteorological observations"), Bulletin of the Hydrographic Office in Austria, 88, pp. 1-27.

W. Pottschacher et al., "VERA—A High Resolution Analysis Scheme for the Atmosphere Over Complex Terrain", MAP Newsletter, No. 5, Oct. 1996, pp. 64-65.

Jonathan M. Eden et al., "Downscaling of GCM-Simulated Precipitation Using Model Output Statistics", Journal of Climate, vol. 27, Jan. 1, 2014, pp. 312-324.

D. Maraun et al., "Precipitation Downscaling Under Climate Change: Recent Developments to Bridge the Gap Between Dynamical Models and the End User", Reviews of Geophysics, 48, Sep. 24, 2010, pp. 1-34.

\* cited by examiner

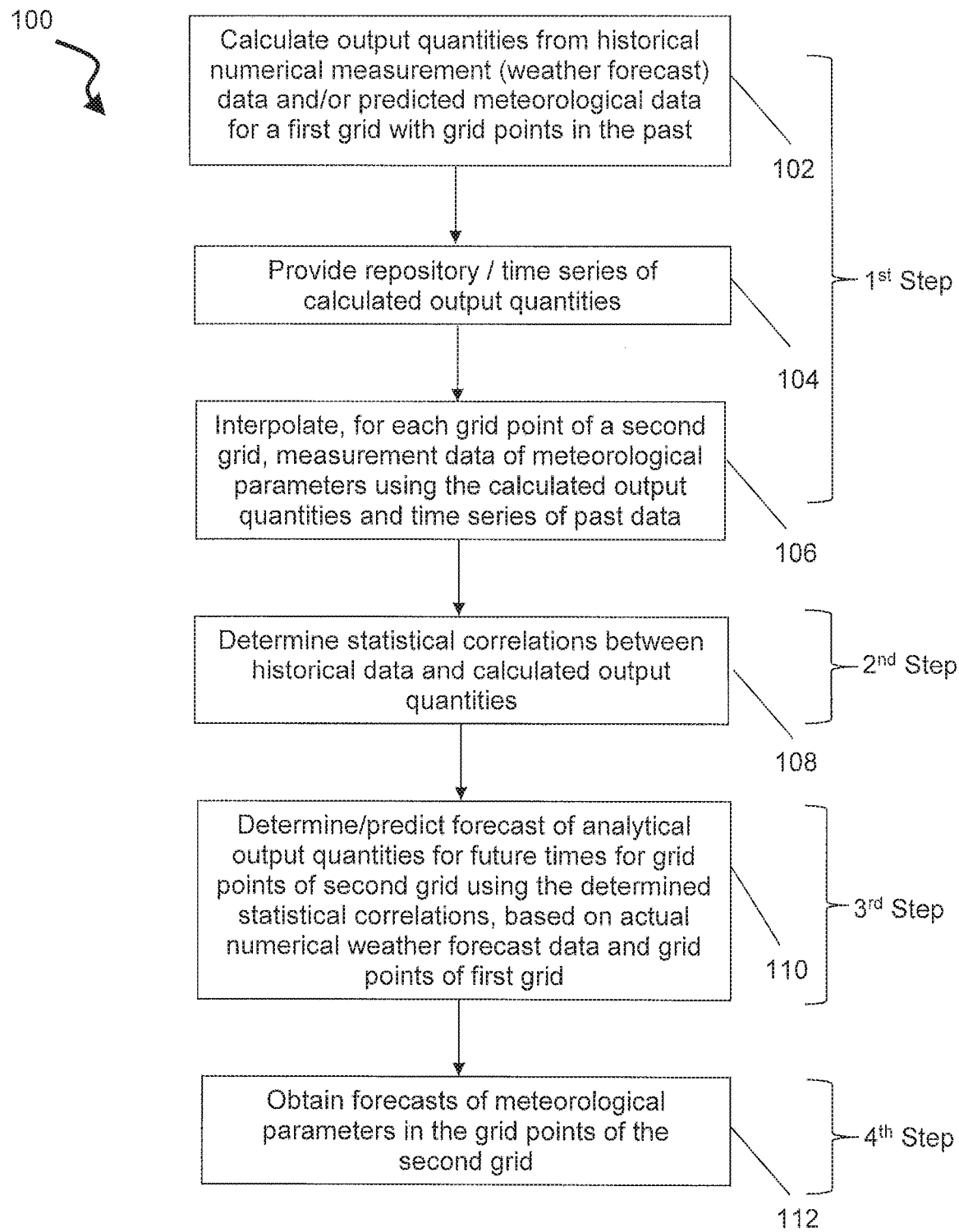

METHOD FOR INCREASING THE SPATIAL RESOLUTION OF A WEATHER FORECAST

CROSS REFERENCE TO RELATED APPLICATION(S)

This application claims priority to European Patent Application No. 17450001.7, filed Jan. 3, 2017, the contents of said applications being incorporated herein by reference in its entirety.

BACKGROUND

Field of the Invention

The invention relates to a method, in particular a computer-implemented method, for increasing the spatial resolution of a weather forecast, in which predicted meteorological parameters are available for grid points of a first grid and the predicted meteorological parameters are interpolated to grid points of a second grid so as to obtain interpolated meteorological parameters, wherein the grid points of the second grid have a higher spatial resolution than the grid points of the first grid. The parameter fields present on the second grid may comprise more small-scale information than in the application of a simple interpolation technique.

Furthermore, the invention relates to a computer program product comprising program code means suitable for carrying out the steps of such a method, when the computer program product is implemented on a computing device. The invention also relates to a computing device programmed for carrying out said method.

Description of Related Prior Art

Numerical weather forecast models are used to predict future developments of meteorological parameters in that the differential equations determining the physics of the atmosphere are solved by numerical methods in a computer-assisted manner. Numerical weather forecast models calculate the future state of the atmosphere at defined times, based on the actual state determined through measurements. With the numerical solution, the differential equations are discretized such that the solutions will only be available for grid points of a grid finitely resolved in terms of space and time and by which the earth is covered like a net. Depending on how far the grid points are spaced-apart, the quality of the forecast varies particularly in the case of ground parameters. A large distance of the grid points induces local inaccuracies, whereas a narrow grid offers higher regionality. In presently employed global numerical weather forecast models, the grid distance is at 10 km and more. The prediction of ground parameters, such as the maximum daily temperature, minimum daily temperature or ground wind for a specific location, is therefore too inaccurate for daily use in many cases. This will, in particular, apply if the meteorological parameters are influenced by very fine-scale orographic effects such as orographic lift, inversions or phenomena due to ground conditions such as deviations in the wind speed due to surface roughness.

As a result, a number of postprocessing methods have become known for refining numerical weather forecasts. Such refinement may, for instance, consist in that the meteorological parameters available on grid points of the numerical weather forecast model are interpolated to intermediate points, such as grid points of a spatially more highly resolved grid, in the sense of downscaling with due regard, to local conditions.

In the context of postprocessing methods, statistical techniques are also frequently used. Model output statistics (MOS) is an established statistical method mostly using multilinear regression equations that serve to correct the forecast results of numerical weather forecast models for a specific location, based on station measurements. In MOB methods, long time series (typically two years and more) of measurements in weather stations are compared with respective historical numerical forecasts, and the statistical correlations found are usually mapped using linear regression models (cf. Glahn H. R. and Lowry D. A: *The Use of Model Output Statistics (MOS) in Objective Weather Forecasting, J. Appl. Meteor.*, 11, 1203-1211 (1972)). Normally, MOB forecasts are significantly more accurate than forecasts derived from the same numerical weather forecast model by simple interpolation. Above all where, in the surroundings of the observed measuring points, influences on the meteorological parameters (such as, topography or ground surfaces) locally vary so strongly that this cannot be mapped in a numerical model with standard resolution.

MOS forecasting in a weather station as described above can be mathematically expressed as follows:

The measured value of a meteorological parameter p (for instance the temperature two meters above ground) in the weather station s at time t is denoted as $$M_{t,p}^{s}$$

and the forecast of a numerical model for a meteorological parameter q on a neighboring model grid point (x,y) for a time t is denoted as $$\varphi_{t,q}(x,y)$$

Usually, separate regression equations are respectively established for each parameter p and each station s, wherein restriction to the model grid point located next to the station is possible. In the sense of a compact way of writing, the indices s and p as well as the coordinates (X,y) will be omitted in the following.

The pairs of measurements and numerical forecasts are determined at several times to obtain a respective time series, which will be subjected to a regression analysis. In the context of the regression analysis, the numerically predicted parameter q is the explaining variable and the measured parameter p is the explained variable, the regression approach thus reading as follows:

$$M'_t = \alpha \varphi_t + \alpha_0 \quad \text{(Formula 1)}$$

However, it is not necessarily required to use as explaining variable only the model parameter corresponding to the measurement parameter p: the temperature measured in the station can, for instance, be explained via a combination of model temperature, model humidity and model pressure. In this case, the regression statement reads as follows (in the simplified way of writing):

$$M'_t = \sum_q \alpha_q \varphi_{t,q} + \alpha_0 \quad \text{(Formula 2)}$$

and the regression coefficients $\alpha_0$, $\alpha_q$ are determined via the minimization of $$\Sigma_t(M'_t - M_t)$$

If the coefficients $\alpha_0$, $\alpha_q$ are known for a station s and a parameter p, it will be possible to establish a MOS forecast for this parameter in this station for any future model forecast.

Since significantly reduced computational expenses are involved in the finding and applying of such statistical correlations than in the solving of the determining differential equations within a numerical model, a MOS postprocessing technique can basically be applied on a spatially significantly more highly resolved grid than would be possible for a numerical weather forecast model.

The idea to use the MOS technique, which was originally designed for the application in weather stations (i.e. irregularly distributed points), in order to obtain refined forecasts on a regular grid, is also well-established (cf. Glahn, D., Gilbert K., Cosgrove R., Ruth D. P. and Sheets K.: *The Gridding of MOS, Wee. Forecasting,* 24, 520-529 (2009)). As described in Glahn, B. and Dallavalle, J. P.: *Gridded MOS-Techniques, Status, and Plans, Preprints,* 18*th Conference on Probability and Statistics in the Atmospheric Sciences,* Atlanta, Ga., Amer. Meteor. Soc., 2.1, it may basically be implemented in three ways:

In the simplest, first case, statistical correlations (such as according to Formula 1 or 2) are derived from historical data in all available weather stations by the MOS method and are then simply used for future forecasts in all other points (with comparable meteorological conditions) of the regular grid.

In the second case, the statistical correlations (such as according to Formula 1 or 2) are derived in the weather stations and used only there to subsequently calculate forecasts on a regular grid from the forecasts for the locations of the weather stations by means of an analysis method.

The third option consists in already interpolating the measurements of the weather stations to a regular grid via an analysis, and to subsequently derive and apply the statistical correlations in each, point of said grid.

A meteorological analysis method for interpolating meteorological parameters is the so-called VERA method (Vienna Enhanced Resolution Analysis). The VERA method is described in more detail in the following articles:

Mayer, D., R. Steinacker, 2013: *VERA—Ein objektives Verfahren zur Analyse von meteorologischen Messwerten. Bulletin of the Hydrographic Office in Austria,* 88, 9-44 (http://www.univie.ac.at/amk/veraflex/test/Facebook/Hydrologisches_Mitteilungsblatt_VER-A.pdf)

Pöttschacher, W., Steinacker, and M. Dorninger, 1996: *VERA—A high resolution analysis scheme for the atmosphere over complex terrain. Preprints, Seventh Int. Conf. on Mesoscale Processes, Reading, United Kingdom, Amer. Meteor. Soc.,* 245-247.

It is the aim of the VERA method to analyze on a regular grid measurement information of irregularly distributed points by incorporating statistically or dynamically predefined fields (fingerprints). The basic idea of the VERA method consists in the reasonable assumption that meteorological fields are additively composed because of different influences (depending on topography or ground surfaces), and that the component independent thereof comprises relatively weak gradients and curvature, i.e. relatively small first and second spatial derivatives. The roughness of a meteorological field is thus supported by the predetermined fingerprint fields weighted in the context of the analysis, wherein a spatial variation is admitted for the weighting factors, yet likewise by applying a smoothness condition. The smooth base portion, which is primarily determined by the general weather situation, is referred to as unexplained component, the weighted fingerprint fields constituting the explained portions.

Mathematically, the VERA analysis is the solution of an optimization problem. On the one hand, the condition of a minimum curvature of the unexplained portion and the weighting factors is imposed on the analytical field and, on the other hand, it is required that even the difference between the analysis and observed values on the station points be minimal.

It is possible, by an appropriate selection of the fingerprint fields, to separate three components having different, physical relevance:
1) A height-invariant portion independent of ground-near impacts (unexplained portion);
2) a portion directly influenced by ground cover and terrain (all explained portions with the exception of the height-determined component);
3) a vertical gradient (weight of the topographic fingerprint).

The split into these components allows for a spatial downscaling of the analysis from the analysis grid with grid point distances within a few kilometers to about 100 meters. It merely depends on the resolution of the fingerprint fields (terrain model and fields derived therefrom, land cover).

The interpolation of measurements irregularly distributed in space, of a meteorological parameter p at the time t to a regular grid according to the VERA method can be mathematically expressed as follows:

$$\{M_{t,p}{}^s/s \in \text{List of Stations}\} \rightarrow A_{t,p}(x,y).$$

As described above, the analysis field $A_{t,p}(x,y)$ can be expressed as the sum of an unexplained portion $\gamma_0$ and an, explained portion, wherein the explained portion can, in turn, be expressed as the sum of products of time-dependent fingerprint weights $\gamma_k$ and time-independent fingerprints $\Psi_k$ (i.e. the explaining static fields):

$$A_{t,p}(x,y) = \Sigma_k \gamma_{k,t,p}(x,y) \Psi_k(x,y) + \gamma_{0,t,p}(x,y).$$

The input variables of a VERA analysis for the parameter p at the time t are thus the measurements $\{M_{t,p}{}^s|s \in \text{List of Stations}\}$ and the fingerprint fields $\Psi(x,y)$. Their results or output variables are the fingerprint weight fields $\gamma_{k,t,p}(x,y)$ and the field of the unexplained portion $\gamma_{0,t,p}(x,y)$, and finally the analysis field $A_{t,p}(x,y)$ (composed thereof).

The described methods are not able to always satisfactorily meet the general need for weather forecasts having a high qualitative accuracy and availability in a high spatial resolution, and involve various disadvantages.

SUMMARY

The present invention aims to overcome the disadvantages pointed out above, and to further improve the forecasting quality of interpolated meteorological parameters and to further enhance the spatial resolution.

To solve this object, the invention in a method of the initially defined kind essentially comprises:
  for grid points of the second grid a time series relating to the past, of output quantities of a meteorological analysis method is each present, said meteorological analysis method being configured to interpolate measured data of meteorological parameters determined in weather measuring stations to the grid points of the second grid;
  for the grid points of the second grid data describing a statistical correlation between the time series of output quantities of the meteorological analysis method and a time series of meteorological parameters that have been predicted in the past at grid points of the first geographic grid are each present;

the data describing the statistical correlation is used to determine, from meteorological parameters predicted for the future and available for the grid points of the first grid, predicted output quantities of the meteorological analysis method for the grid points of the second grid; and the synthesis step of the meteorological analysis method is performed with the predicted output quantities to obtain forecasts of the meteorological parameters in the grid points of the second grid.

BRIEF DESCRIPTION OF THE DRAWING

FIG. 1 illustrates a method for increasing the spatial resolution of a weather forecast in accordance with an embodiment of this disclosure.

DETAILED DESCRIPTION OF THE INVENTION

Definition of Terms

In meteorology, a number of methods are used to describe and/or model the state of the atmosphere and to determine therefrom meteorological quantities by computational methods. In the description of the present invention, the relevant meteorological methods are defined as follows.

By "meteorological analysis", a description as precise as possible of the instantaneous state of the atmosphere at a defined time (in the past) is to be understood. A "meteorological analysis method" is a method that serves to interpolate measurements irregularly distributed in space by incorporating additional information. In the most general case, these are relations assigning fields of these parameters to a finite number of measurements of defined meteorological parameters.

By "downscaling", a spatial interpolation of meteorological quantities known on a regular grid is understood. Such interpolation is performed by incorporating additional information known on a regular, more finely resolved grid.

"Postprocessing" serves to denote methods that are used for a subsequent refinement of weather forecasts generated by numerical weather models. They may comprise both downscaling methods and statistical methods for determining and correcting possible systematic errors of such methods (e.g. the MOS method described further below). Such methods also enable the generation of forecasts for parameters that are not directly predicted by the numerical weather model hut correlate sufficiently strongly with predicted weather parameters.

By a "MOS method" in the widest sense, a method of machine learning is understood, in which forecasts of a numerical weather model are used as independent (i.e. explaining) variable. In addition, other independent variables may also be included in such a method. Measurements or quantities derived from measurements are used as dependent (i.e. explained) variables. MOS methods are frequently, but not necessarily implemented as regression methods.

FIG. 1 illustrates a method 100 for increasing spatial resolution of a weather forecast in accordance with an embodiment of this disclosure.

The method 100 for increasing the spatial resolution of a weather forecast includes: for grid points of the second grid a time series relating to the past, of output quantities of a meteorological analysis method is each present, said meteorological analysis method being configured to interpolate measured data of meteorological parameters determined in weather measuring stations to the grid points of the second grid. For the grid points of the second grid data describing a statistical correlation between the time series of output quantities of the meteorological analysis method and, a time series of meteorological parameters that have been predicted in the past at grid points of the first grid are each present. The data describing the statistical correlation is, used to determine, from meteorological parameters predicted for the future and available for the grid points of the first grid, predicted output quantities of the meteorological analysis method for the grid points of the second grid. A synthesis step of the meteorological analysis method is performed with the predicted output quantities to obtain forecasts of the meteorological parameters in the grid points of the second grid.

The method according to the invention thus combines an analysis method (such as VERA), which interpolates spatially irregularly distributed measurements to a regular grid, with a statistical postprocessing method (such as MOS), which above all is to compensate for systematic errors in numerical weather forecast models. The postprocessing method, moreover, enables a forecast of any parameters for which time series are available (such as the fingerprint weights and the unexplained portion of the VERA analysis), as a function of the numerical weather forecasts. By combining the two methods, an increase in the spatial resolution of weather forecasts and an optimization of the forecast quality are achieved. Such a combination is not effected in that the analyses are approximated by simple interpolation to the target grid and there by means of regression from the model data. The invention rather follows a new path by integrating one method into the other such that the statistical postprocessing method is used to predict at least one output quantity of the analysis method.

The method 100 according to the invention substantially comprises four steps, the first two of which merely have to be performed once while the other two steps are required for every forecast. In the first step, a meteorological analysis is carried out, wherein output quantities of the analysis method are calculated from historical measurement data, shown as 102 in FIG. 1, so as to obtain a repository, i.e. a time series, of the calculated output quantities, shown as 104 of FIG. 1. The time series in this case, for instance, extends over at least one year, preferably over at least two years. In detail, it is preferably operated such that measurement data of meteorological parameters determined in the past in weather measuring stations are interpolated to grid points of the second grid by using the meteorological analysis method, shown as 106 of FIG. 1, wherein interpolating, in respect to each grid point of the second grid, comprises the calculating of the output quantities of the analysis method and said interpolating is effected for a multitude of times in the past.

In the second step, shown as 108 in FIG. 1, statistical correlations are found between historical numerical weather forecast data and the output quantities calculated in the first step.

In the third step, shown as 110 of FIG. 1, a forecast of the analytical output quantities for future times is made by applying the correlations found in the second step, based on actual numerical weather forecast data.

In the fourth step, shown as 112 in FIG. 1, the synthesis of the predicted output quantities and the additional information used in the analysis method is effected to obtain the desired forecasts of the meteorological parameters in the grid points of the second grid.

Concerning the analysis method, it is preferably provided that the analysis method comprises a VERA method, said VERA method, in respect to each grid point of the second grid, comprising the establishing of an interpolation function in which a meteorological parameter of the respective grid point is described as a function of an unexplained portion and of fingerprint fields weighted with weighting factors, the unexplained portion and the weighting factors constituting the aforementioned output quantities. As pointed out in the introduction, the VERA method, in particular, allows for the consideration of location-specific factors of influence on the desired meteorological parameters.

Concerning the statistical correlation in the second step, it is preferably provided that the statistical correlation is determined by means of a regression analysis. Said regression analysis, in particular, comprises a model output statistics (MOS) method.

The integration of the regression analysis into the VERA method preferably is performed such that the regression analysis comprises the establishment of at least one regression equation by which an output quantity of the analysis method is described as a linear combination of meteorological parameters predicted in, the past on at least one grid point of the first grid.

The integration of the regression or MOS method into the VERA method is, in particular, performed in that at least one weighting factor and/or the unexplained portion is/are used as the output quantity to be described by the at least one regression equation.

In the context of the regression analysis, it is subsequently preferably proceeded such that the output quantity to be determined, i.e., for instance, the at least one weighting factor and/or the unexplained portion of the VERA method, represents the explained variable, and the forecasts of a numerical weather model in grid points of the first grid (or values determined by the simple interpolation of these forecasts) constitute the explaining variables. In the simplest case, just a single meteorological parameter derived from the numerical weather model can be used as explaining variable such that the regression statement will correspond to the above-mentioned Formula 1.

In a preferred manner, the dependent variable in the regression equation, in particular the at least one weighting factor and/or the unexplained portion of the VERA method, may also be a function of several meteorological parameters derived from the numerical weather model. The regression statement, will consequently correspond to the above-mentioned Formula 2. In other words, it is provided that the regression analysis comprises the establishment of at least one regression equation by which an output quantity of the analysis method is described as a linear combination of meteorological parameters predicted in the past on at least one grid point of the first grid.

A preferred embodiment provides, as known per se, that the MOS method is performed according to the method of least squares.

A special advantage of the method according to the invention consists in that the output quantities determined by the statistical correlation in the third step of the method, in particular the MOS method, can be used in the context of the VERA method (fourth step) to perform further downscaling of the resulting forecasts. This will, for instance, be feasible by the use of a digital terrain model that is even more highly resolved than the second grid. It will thus be possible to perform the synthesis step of the VERA method with fingerprint fields representing the higher resolution, while the weighting factors and the unexplained portion determined in the third step of the method for the nearest grid point of the second grid can be left unchanged. It was found that in this manner a high-quality forecast with a very high spatial resolution will be achieved if a correspondingly precise description of the location-specific factors of influence is feasible.

To this end, the method according to the invention is preferably further developed such that the predicted output quantities are used in the meteorological analysis method for interpolating a meteorological parameter for a neighboring intermediate point located between the grid points of the second grid.

For the determination of the meteorological parameter of the intermediate point, an interpolation function of the VERA method is, in particular, applied, which, in said intermediate point, comprises valid fingerprint field values and either the same unexplained portion and the same weighting factors as the next neighboring point of the second grid or values of the unexplained portion and the weighting factors simply interpolated from the four neighboring grid points of the second grid.

In general, the method according to the invention is suitable for further processing forecast parameters of any origin. Most frequently, the forecast meteorological parameters are determined by a numerical weather forecast.

Concerning the selection of the meteorological parameters, there are no limitations, either. The meteorological parameters preferably comprise air temperature, relative humidity, air pressure, wind direction, wind speed, wind gusts, cloud cover and/or precipitation and/or parameters derivable therefrom.

Mathematically, the method according to the invention in a preferred configuration can be illustrated as follows. Corresponding to the VERA method discussed in the introduction, it is initially started from the following VERA equation:

$$A_{t,p}(x,y) = \Sigma_k \gamma_{k,t,p}(x,y) \Psi_k(x,y) + \gamma_{0,t,p}(x,y).$$

The approach according to the invention consists in establishing separate MOS regression equations each for the unexplained portion $\gamma_{0,t,p}(x,y)$ and for the fingerprint weights $\gamma_{k,t,p}(x,y)$. To this end, the unexplained portion and the fingerprint weights are each formulated as functions of meteorological parameters $\varphi$, i.e. as a linear combination $\alpha_0 + \alpha_1 \varphi_1 + \alpha_2 \varphi_2 + \ldots$. For each parameter p and in each grid point (x,y) apply separate equations, the respective dependencies being again omitted for the sake of compactness:

$$\gamma'_{0,t} = \sum_q \alpha_{0,q} \varphi_{t,q} + \alpha_{0,0}$$

$$\gamma'_{k,t} = \sum_q \alpha_{k,q} \varphi_{t,q} + \alpha_{k,0}$$

After having calculated the regression coefficients $\alpha_{0,0}$, $\alpha_{0,q}$ and $\alpha_{k,0}$, $\alpha_{k,q}$ by the usual minimizations of $$\Sigma_t (\gamma'_{0,t} - \gamma_{0,t})^2 \text{ and}$$

$$\Sigma_t (\gamma'_{k,t} - \gamma_{k,t})^2$$

the portions of the "MOS-predicted VERA analysis" can then be calculated for any future model forecast.

Exemplary Embodiment

In the following, the invention will be explained in more detail by way of an exemplary embodiment.

Step 1—VERA Analysis

In the context of the VERA analysis, the interpolation of measurement data of meteorological parameters present on irregularly distributed points (weather stations) to a regular grid is performed by taking into consideration (in particular temporally constant) additional information (such as orography, ground properties). The VERA analysis can be performed for any point in time for which measurement data are available, individually and independently of any other treated time instants. Input data comprises the measured values (different for each time) and the (normally temporally constant, yet of course spatially varying) additional information fields (fingerprints). Output data comprises the spatially and temporally varying fingerprint weights and the likewise spatially and temporally varying unexplained portion of the analysis.

In practice, the VERA analysis is performed on a grid of selectable spatial resolution, which may at most be the resolution at which the fingerprint fields are available. Normally, a coarser resolution is, however, chosen. In the first step of the herein described method, the VERA analysis is performed on a grid ("second grid") that is more coarsely resolved than the fingerprint fields, wherein the analysis is, for instance, carried out in an hourly time frame extending over a total of two years or more. After this, a time series of output quantities of the VERA analysis, i.e. a time series for the fingerprint weights and the unexplained portion of the analysis, will be available for each spatial point of the selected grid.

Step 2—Training of a MOS Method for Forecasting Fingerprint Weights and the Unexplained Analysis Portion:

The time series of the fingerprint weight fields and of the unexplained analysis portion from step 1 can be considered individually for each grid point and for each fingerprint type. Moreover, stored weather forecasts from a numerical model are available for the same period for grid points of a less resolved grid ("first grid"). In a MOS approach, the time series of the fingerprint weights and of the unexplained portion are then brought into statistical relation with time series of the historical forecast weather parameters from the numeric model. In doing so, the fingerprint weights and the unexplained portion in the present case of the MOS application constitute the dependent (explained) variable, while the forecast weather parameters from the numerical model are considered as independent (explaining) variable. The fact that the spatial resolution of the numerical weather model is coarser than that representing the VERA analyses is no problem, since it is expected that spatial details will be obtained by performing the MOS method separately for each point of the VERA grid. If the MOS method is based on a linear regression analysis (which is usually the case), coefficients of a regression equation will be obtained as output data of step 2 for each point of the VERA grid ("second grid"), which regression equation relates the forecast weather parameters from the numerical model to the respectively considered VERA component.

Basically, step 1 and step 2 have to be performed just once. The output data of step 2 are applied in the following step on a regular basis (whenever a new forecast of the used numerical weather model is available, i.e. several times a day).

Step 3—Operational Use of the Model for the Regular Forecast of VERA Parameters:

After this, the forecast weather parameters from the model can be inserted in the respective regression equation determined in step 2, and predicted fingerprint weights and the predicted unexplained analysis portion for all points of the "second grid", on which, the historical analyses (step 1) are present, can be calculated for each future point in time for which a numerical weather forecast (but no measurements and hence no VERA analysis yet) is available.

Step 4—Synthesis of the Forecast Analysis and VERA Downscaling:

On the one hand, the forecasts of the fingerprint, weights and of the unexplained portion calculated in step 3 allow for the recomposition of a forecast analysis on the "second" grid, but, on the other hand, further downscaling using more finely resolved fingerprint fields is possible.

The invention claimed is:

1. A method for increasing spatial resolution of a weather forecast, in which predicted meteorological parameters are available for grid points of a first grid and predicted meteorological parameters are interpolated to grid points of a second grid so as to obtain interpolated meteorological parameters, wherein the grid points of the second grid have a higher spatial resolution than the grid points of the first grid, and wherein:
   a first time series for each of the grid points of the second grid is present, each first time series relating to past output quantities that are obtained via a meteorological analysis method being configured to interpolate measured data of meteorological parameters determined in weather measuring stations to the grid points of the second grid;
   for each of the grid points of the second grid; data is provided describing a statistical correlation between the first time series of past output quantities of the meteorological analysis method and a second time series of meteorological parameters that have been predicted in the past at grid points of the first grid;
   the provided data describing the statistical correlation is used to determine, from meteorological parameters predicted for the future and available for the grid points of the first grid, predicted output quantities of the meteorological analysis method for the grid points of the second grid; and
   a synthesis step of the meteorological analysis method is performed with the predicted output quantities to obtain forecasts of the meteorological parameters in the grid points of the second grid.

2. The method for increasing spatial resolution according to claim 1, wherein the time series relating to the past, of output quantities of a meteorological analysis method is obtained in that measurement data of meteorological parameters determined in the past in weather measuring stations are interpolated to grid points of the second grid by using the meteorological analysis method; wherein interpolating, in respect to each grid point of the second grid, comprises the calculating of the output quantities of the meteorological analysis method, and said interpolating is effected for a multitude of times in the past.

3. The method for increasing spatial resolution according to claim 1, wherein the meteorological analysis method comprises a Vienna Enhanced Resolution Analysis (VERA) method, said VERA method, in respect to each grid point of the second grid, comprising establishing of an interpolation function in which a meteorological parameter of the respective grid point is described as a function of a smooth base portion, which is primarily determined by a general weather situation as an unexplained portion, and of fingerprint fields weighted with weighting factors, the unexplained portion and the weighting factors constituting the output quantities of the meteorological analysis method.

4. The method for increasing spatial resolution according to claim 1, wherein the statistical correlation is determined by means of a regression analysis.

5. The method for increasing spatial resolution according to claim 4, wherein the regression analysis comprises establishing of at least one regression equation by which an output quantity of the meteorological analysis method is described as a linear combination of meteorological parameters predicted in the past on at least one grid point of the first grid.

6. The method for increasing spatial resolution according to claim 5, wherein a separate regression equation is established for each output quantity of the meteorological analysis method.

7. The method for increasing spatial resolution according to claim 4, wherein said regression analysis comprises a model output statistics (MOS) method.

8. The method for increasing spatial resolution according to claim 7, wherein the MOS method is performed using a least squares method.

9. The method for increasing spatial resolution according to claim 1, wherein the meteorological parameters predicted in the past-were determined based on the grid points of the first grid by a numerical weather forecast.

10. The method for increasing spatial resolution according to claim 1, wherein the predicted output quantities are used in the meteorological analysis method for interpolating a meteorological parameter for a neighboring intermediate point located between the grid points of the second grid.

11. The method for increasing spatial resolution according to claim 10, wherein, for determining the meteorological parameter of the intermediate point, a Vienna Enhanced Resolution Analysis (VERA) method is used comprising establishment of an interpolation function in which a meteorological parameter of a respective grid point is described as a function of a smooth base portion, which is primarily determined by a general weather situation as an unexplained portion, and of fingerprint fields weighted with weighting factors, which, in said intermediate point, the meteorological parameter comprises: either (a) valid fingerprint field values and the same predicted unexplained portion and the same predicted weighting factors as at least one neighboring grid point of the second grid, or (b) valid fingerprint field values, a value interpolated from the predicted unexplained portion, and a value interpolated from the predicted weighting factors.

12. The method for increasing spatial resolution according to claim 1, wherein the meteorological parameters comprise air temperature, relative humidity, air pressure, wind direction, wind speed, wind gusts, cloud cover and/or precipitation and/or parameters derivable therefrom.

13. A computer program product comprising program code means suitable for carrying out the steps of the method for increasing spatial resolution according to claim 1, when the computer program product is implemented on a computing device.

14. A computing device for carrying out the method for increasing spatial resolution according to claim 1, wherein the computing device is programmed with a computer program product comprising program code suitable for carrying out the method.

15. The method for increasing spatial resolution according to claim 1, wherein the meteorological parameters predicted for the future are determined based on the grid points of the first grid by a numerical weather forecast.

* * * * *